Figure 1:
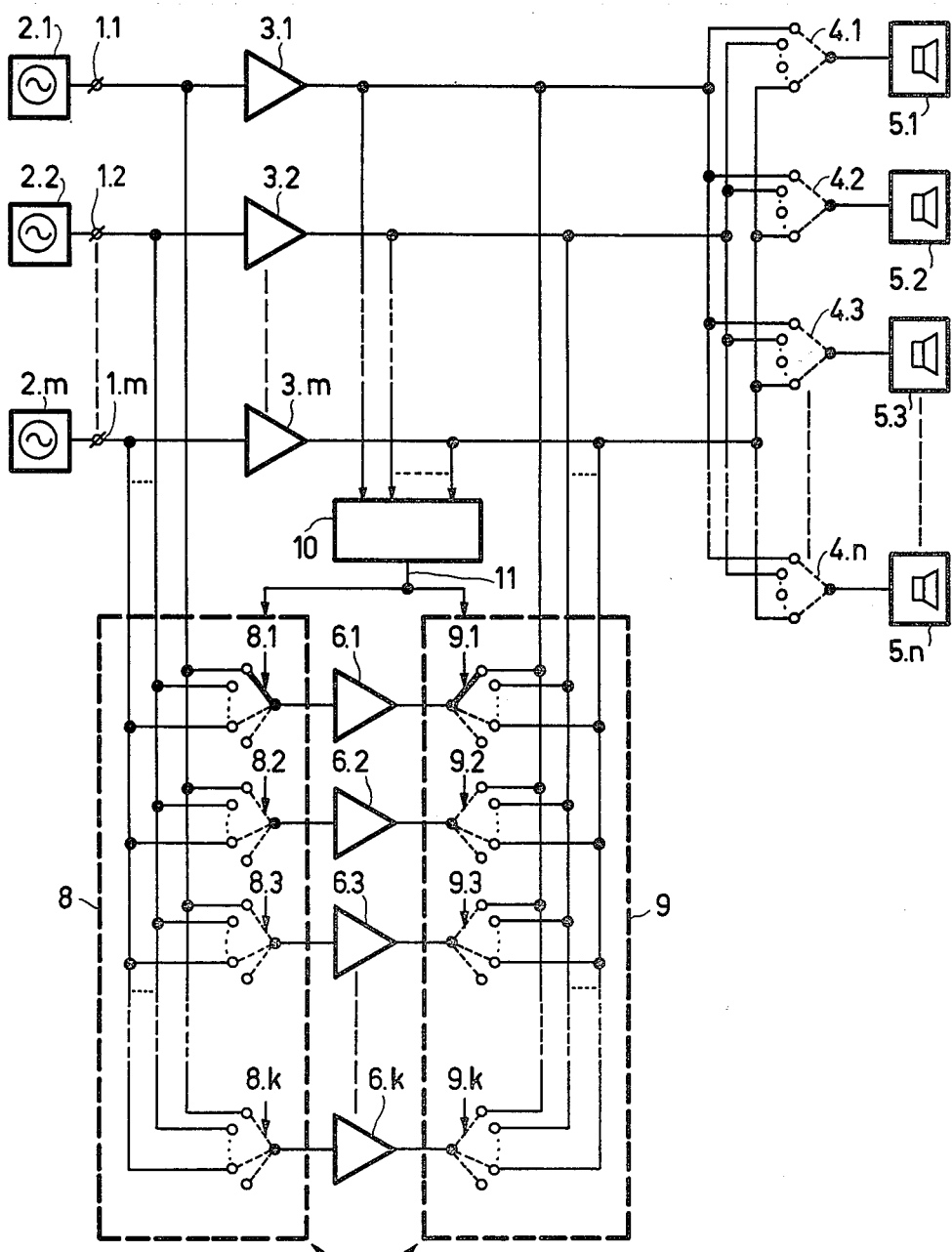

United States Patent [19]

de Koning et al.

[11] Patent Number: 4,481,660
[45] Date of Patent: Nov. 6, 1984

[54] APPARATUS FOR DRIVING ONE OR MORE TRANSDUCER UNITS

[75] Inventors: Stephanus H. de Koning; Willem A. L. Smallenberg, both of Breda, Netherlands

[73] Assignee: U.S. Philips Corporation, New York, N.Y.

[21] Appl. No.: 443,008

[22] Filed: Nov. 19, 1982

[30] Foreign Application Priority Data

Nov. 27, 1981 [NL] Netherlands ................. 8105371

[51] Int. Cl.$^3$ ............... H03F 21/00; H04R 29/00
[52] U.S. Cl. ............... 381/58; 381/81; 381/84; 381/85; 381/120; 330/51; 330/124 R
[58] Field of Search .......... 381/24, 25, 28, 56–60, 381/82–85, 98–109, 119–121, 123, 80, 81; 330/51, 295, 124 R–126

[56] References Cited

U.S. PATENT DOCUMENTS

| | | | |
|---|---|---|---|
| 2,260,170 | 10/1941 | Curl | 381/84 |
| 3,051,788 | 8/1962 | Seely | 381/120 |
| 3,584,153 | 6/1971 | Kinzer | 381/84 |
| 4,176,251 | 11/1979 | Collen et al. | 381/59 |

*Primary Examiner*—Gene Z. Rubinson
*Assistant Examiner*—W. J. Brady
*Attorney, Agent, or Firm*—Robert T. Mayer; Bernard Franzblau

[57] ABSTRACT

An apparatus for driving n transducer units (n>1), each comprising one or more electro-acoustic transducers, comprises m signal inputs (m≧1) for connecting m signal sources to the apparatus. Each signal input is connected to an associated amplifier unit and there are n signal outputs to which said transducer units may be connected. A signal input is connectable to one or more of the signal outputs via the associated amplifier unit. The apparatus further comprises k auxiliary amplifier units (k≧1) with one or more of said auxiliary amplifier units being connectable in parallel with an arbitrary amplifier unit so that the total power of the apparatus may be reduced substantially.

29 Claims, 6 Drawing Figures

APPARATUS FOR DRIVING ONE OR MORE TRANSDUCER UNITS

This invention relates to an apparatus for driving n transducer units (n>1), wherein the transducer units each comprise one or more electro-acoustic transducers, the apparatus comprises m signal inputs (m≧1) for connecting m signal sources to the apparatus, each signal input being connected to an input of an associated amplifier unit, the apparatus further comprises n signal outputs to which the said n transducer units may be connected, a signal input being connectable to one or more of the signal outputs via the associated amplifier unit. Such an apparatus is known from U.S. Pat. No. 1,911,721. The known apparatus comprises three signal sources with associated amplifier units and three transducer units, each in the form of six electro-acoustic transducers. Each of the transducer units may be connected to any one of the three amplifier units. This means that when the three transducer units are all connected to one specific amplifier unit the output power of this amplifier unit should be sufficiently high to drive the three transducer units at a sufficient level. The output power of each amplifier unit is therefore selected to be so high that even when the maximum load is connected to an amplifier unit the drive still suffices. As a result, the total power installed in the apparatus is substantially higher than the maximum power demanded by the transducer units.

It it is assumed that the n transducer units require powers of $Q_1, Q_2, \ldots Q_i, \ldots Q_n$ Watts respectively, this means that if all the transducer units are connected to one amplifier unit the transducer units demand a maximum power of $$\sum_{i=1}^{n} Q_i$$

Watts. In an apparatus comprising m amplifier units the installed power is then $$m \sum_{i=1}^{n} Q_i$$

Watts, which for m≠1 means a multiple of the required power of $$\sum_{i=1}^{n} Q_i$$

Watts.

A numerical example: a known apparatus comprising (n=) 3 transducer units, each having a power of $Q_1=Q_2=Q_3=10$ Watts, to which (m=) 4 signal sources may be connected, has an installed power of 120 Watts, whereas in fact only a maximum of 30 Watts is required. It is an object of the invention to provide an apparatus in which the installed power can be reduced substantially, while still allowing all transducer units, even when they are all connected to the same amplifier unit, to be driven to the maximum extent. The apparatus according to the invention is characterized in that it further comprises k auxiliary amplifier units (k≧1) and switching means for connecting one or more auxiliary amplifier units in parallel with an arbitrary amplifier unit.

The idea of the invention is based on recognition of the fact that, by arranging a plurality of auxiliary amplifier units in parallel with a number of fixed amplifier units, which auxiliary amplifier units may each be connected in parallel with an arbitrary amplifier unit, the total power installed in the apparatus can be reduced significantly.

Let us again assume that the n transducer units require powers of $Q_1, Q_2, \ldots Q_n$ Watts respectively. Let us assume, moreover, that the m amplifier units have powers of $p_{v1}, p_{v2}, \ldots p_{vi}, \ldots p_{vm}$ respectively and the k auxiliary amplifier units have powers of $p_{h1}, p_{h2}, \ldots p_{hi}, \ldots p_{hk}$ respectively so that the total installed power in this case is $$\sum_{i=1}^{m} p_{vi} + \sum_{i=1}^{k} p_{hi} \qquad (1)$$

In order to obtain a better idea of the possible ratio between the installed power of the apparatus in accordance with the invention, formula (1), and the installed power of the known apparatus, i.e.

$$m \sum_{i=1}^{n} Q_i,$$

the situation will be simplified by assuming that the output powers of the amplifier units are all equal to $p_v$ and the output powers of the auxiliary amplifier units are all equal to $p_h$. Further, it will also be assumed that the required power $Q_i$ for each of the transducer units is equal to Q.

An apparatus in accordance with the invention. may then comprise.

m amplifier units of $p_v$ Watts, and $$k = \frac{nQ - p_v}{p_h}$$

auxiliary amplifier units of $p_h$ Watts (2).

The number of auxiliary amplifier units k is obtained in accordance with formula (2) by calculating how many auxiliary amplifier units have to be connected in parallel with an amplifier unit in order to obtain maximum drive of the transducer units if these transducer units are all connected to the said amplifier unit. The total power installed, as represented by formula (1), may now be simplified to the following formula:

$$nQ + p_v(m-1) \text{ Watts} \qquad (3)$$

In comparison with the known apparatus this is an economy of:

$$mnQ - \{nQ + p_v(m-1)\},$$

which is $$(m-1)(nQ - p_v) \text{ Watts} \qquad (4)$$

Another numerical example will now be given: an apparatus in accordance with the invention is itself adapted to drive (n=) 3 transducer units, each having a power of (Q) = 10 Watts. Again there are (m=) 4 signal sources, i.e. four fixed amplifier units each having a power $p_v$ of, for example, 10 Watts. If the auxiliary amplifier units have a power $p_h$ of, for example, 10 Watts, two such auxiliary amplifier units are needed. However, if they have a power of, for example, 5 Watts, four such units are required, see formula (2). The power installed in this apparatus is now 60 Watts, which is an economy of 60 Watts in comparison with the known apparatus. As already implied, the power ratings of the amplifier units need not be equal to each other. The same applies to the power ratings of the various auxiliary amplifier units. Nor is it necessary that the powers required by the transducer units be the same. However, preferably amplifier units and/or auxiliary amplifier units will be used which all have at least substantially equal output power capabilities. This means that at the most two different types of amplifier are required in an apparatus so that the circuit arrangement of the amplifiers in the apparatus can be simplified. In addition, this means that a smaller number of units needs to be kept in stock for repairing and replacing the amplifiers in the apparatus. Furthermore, it facilitates integration of the entire circuitry. It will be evident that for $m=n=1$, i.e. when there is only one signal input and only one transducer unit, the installed power exactly corresponds to the required power. The step in accordance with the invention is then useless. It will also be evident that the invention has no use when $n=1$ and $m\neq1$.

A particular embodiment of the invention is characterized in that the output power capability of each amplifier unit is smaller than the power-handling capability of a transducer unit to be connected to its signal output. This embodiment has the advantage that the total power installed in the apparatus may be reduced further. In this embodiment it is even possible, in some cases, to approximate the minimum required power of $$\sum_{i=1}^{n} Q_i$$

($=nQ$ in the case that all transducer units require a power of Q Watts).

A third numerical example, using the foregoing formulas, will clarify this. In this third example the apparatus of the second example is used, but now the power $p_v$ of each of the fixed amplifier units is 5 Watts. Five auxiliary amplifier units of 5 Watts each are required in addition. The installed power in this apparatus is therefore only 45 Watts.

A fourth example: if the amplifier units each have a power $p_v$ of 1 Watt (which means that 29 auxiliary amplifier units of 1 Watt are needed in addition), the installed power is only 33 Watts, which approximates very closely to the minimum required power of 30 W. The last example shows that if the output power of each of the auxiliary amplifier units is selected to be lower, preferably substantially lower, than the power required for an arbitrary transducer unit, the closest approximation to the minimum required power of $$\sum_{i=1}^{n} Q_i$$

(or nQ) can be obtained. Moreover, if in such a case an amplifier unit which already has its maximum load is loaded by an additional transducer unit, switching in one or more auxiliary amplifier units need give rise to only the smallest possible overcapacity, so that the apparatus operates even more efficiently.

Another particular embodiment of the invention is characterized in that the apparatus further comprises a measuring unit for measuring the load on an amplifier unit and supplying control signals to the switching means; the switching means are adapted to connect, in response to these control signals when the load on said amplifier unit increases, as many auxiliary amplifier units in parallel with said amplifier unit as is necessary in view of the increased load on the amplifier unit and, when the load on said amplifier unit decreases, to disconnect as many auxiliary amplifier units from said amplifier unit as is permissible in view of the reduced load on the amplifier unit. In this way it is possible to determine whether and how many auxiliary amplifier units should be connected in parallel with an amplifier unit if the load on this amplifier unit increases and, furthermore, it is possible to determine how many auxiliary amplifier units may be disconnected if the load on the amplifier unit decreases. The load on an amplifier unit may, for example, be determined by determining the ratio between the average output voltage and the average output current. Alternatively it is possible to use only the output current of each amplifier unit as an indication of the magnitude of the load. It is to be noted that the instant of switching will, in the latter case, also be determined by the voltage level of the output signal of the amplifier unit.

Figure 2B:
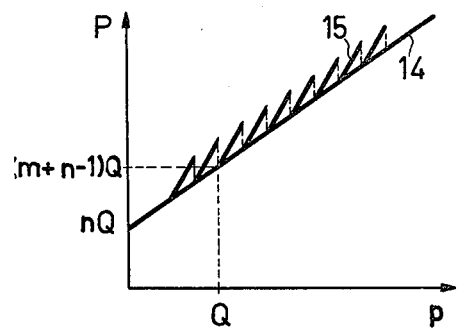
Figure 2A:
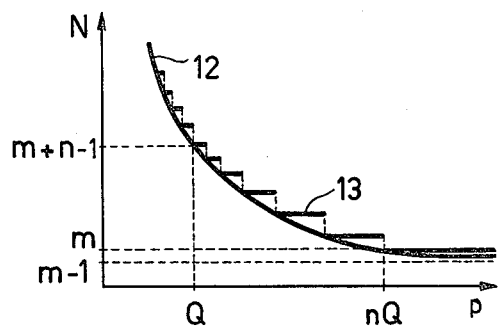

Embodiments of the invention will now be described in more detail, by way of example, with reference to the drawings. In these drawings:

FIG. 1 shows a first embodiment of the invention,

FIG. 2, in FIG. 2a, shows the total number of amplifier units and auxiliary amplifier units required as a function of the power per amplifier unit and, in FIG. 2b, shows the total power installed as a function of the power per amplifier unit for a simplified apparatus in accordance with the invention, the power ratings of the amplifier units and of the auxiliary amplifier units all being equal.

Figure 3:
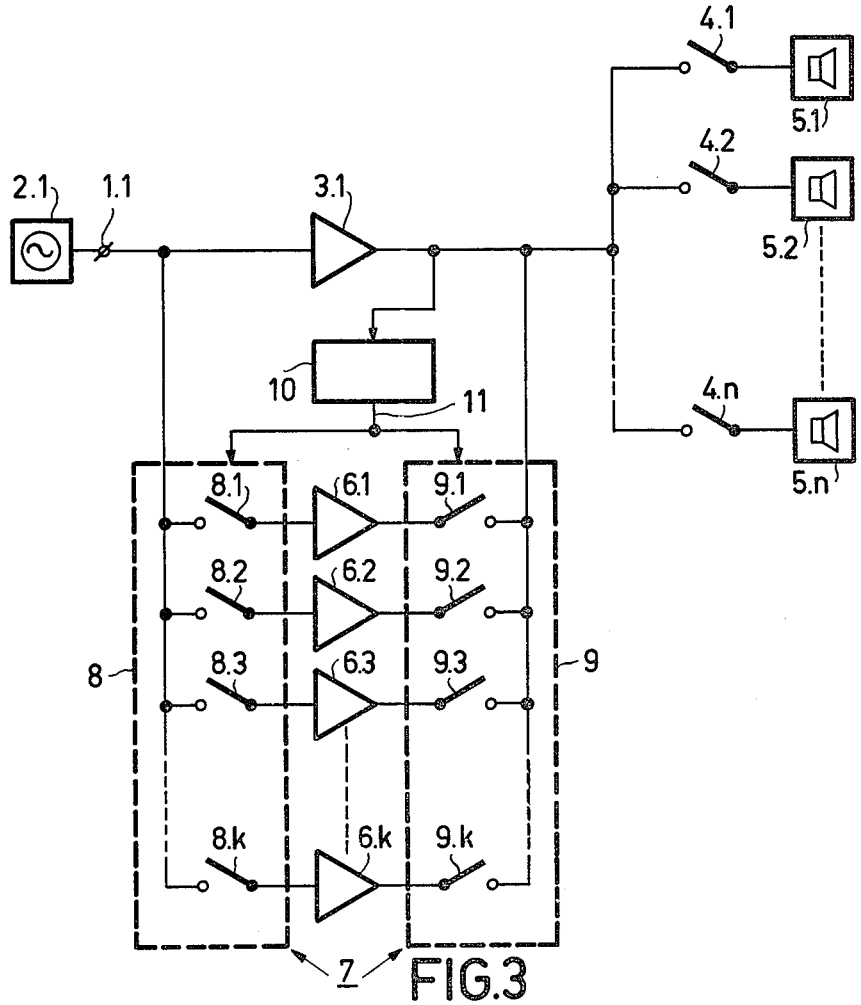
Figure 4:
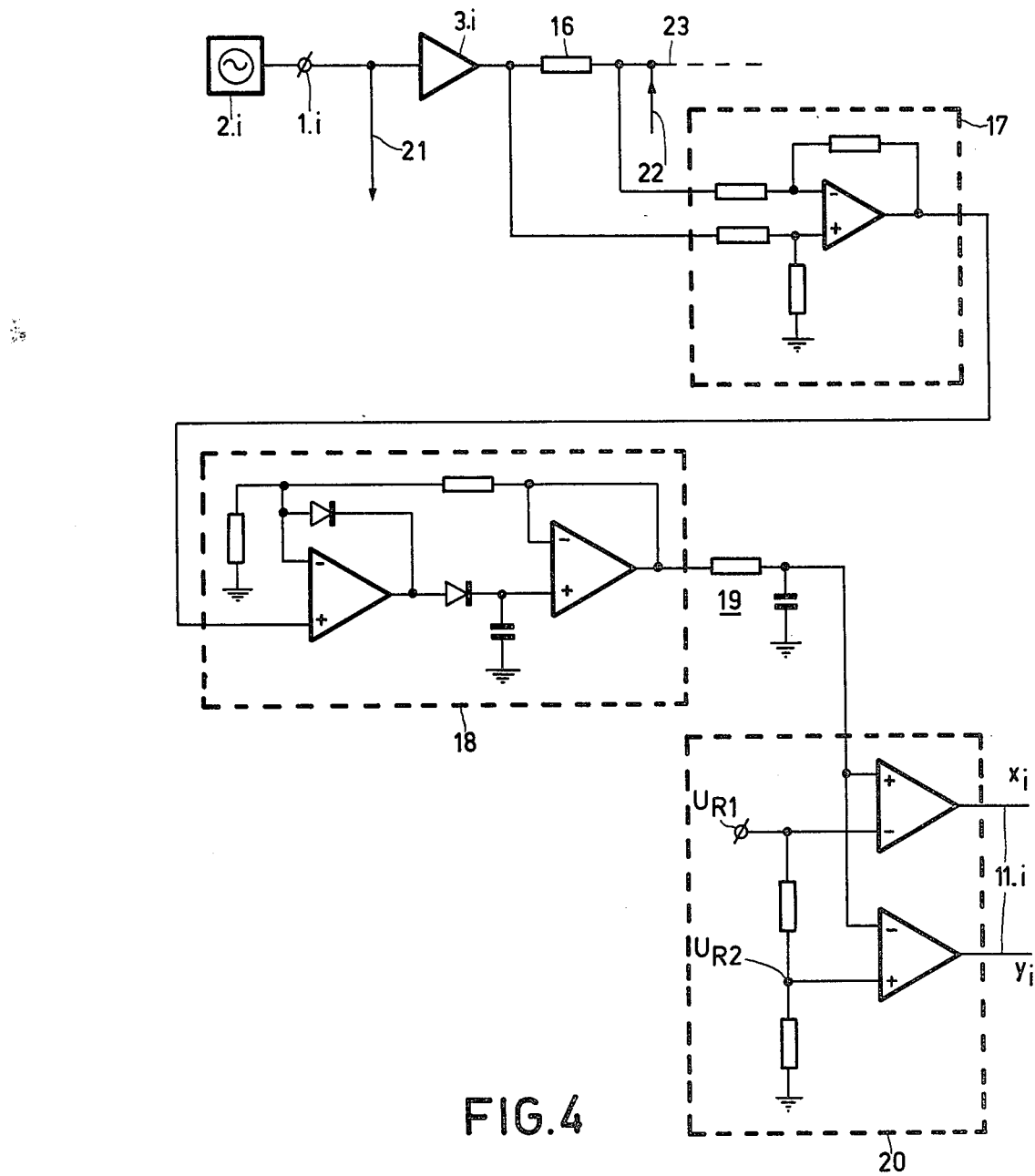
Figure 5:
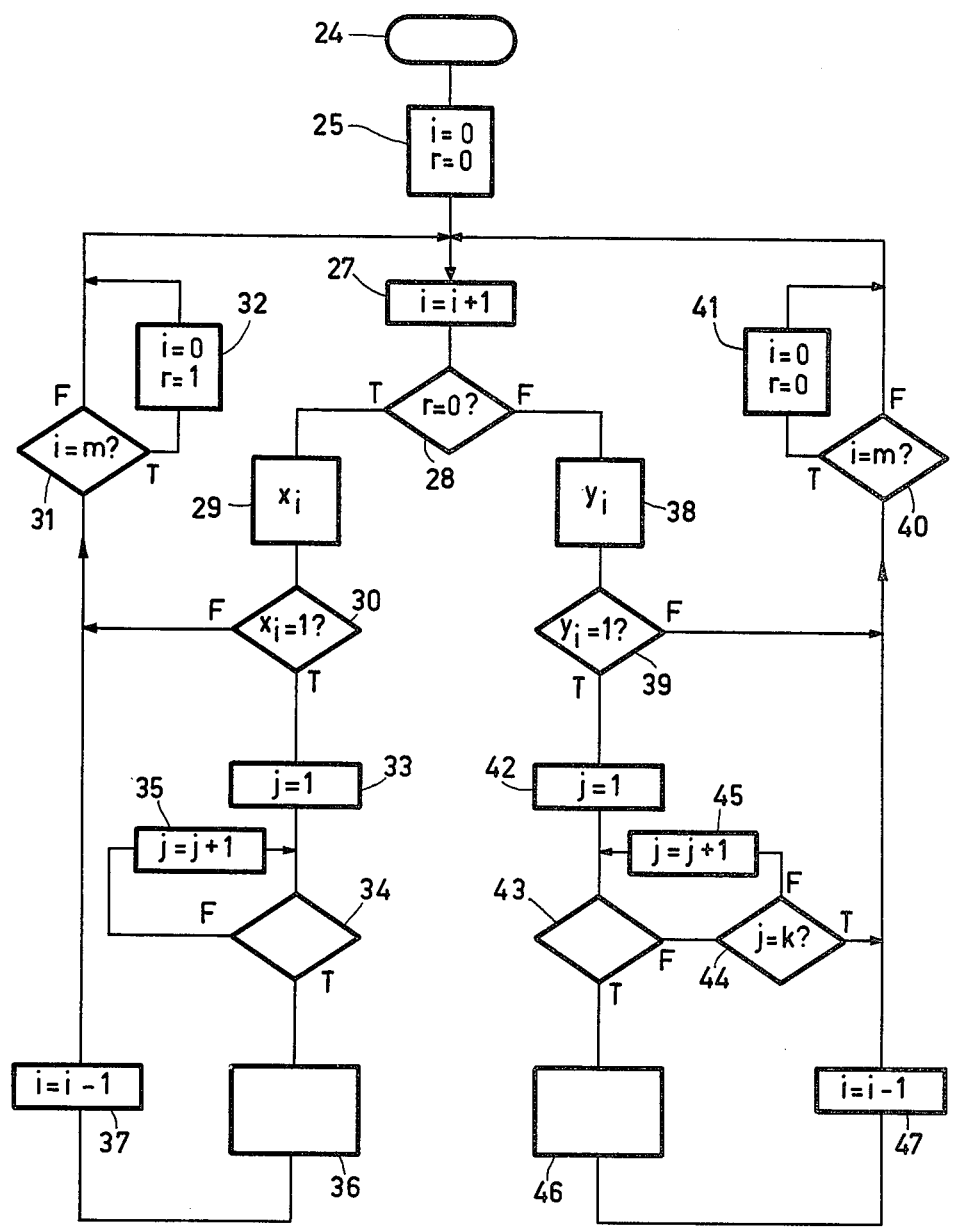

FIG. 3 shows a second embodiment in which only one signal source may be connected to the apparatus, FIG. 4 shows a possible version of a measuring unit in the embodiments of FIGS. 1 and 3, and FIG. 5 is a decision chart relating to the operation of the switching means in the embodiment of FIG. 1.

The apparatus in accordance with the invention shown in FIG. 1 comprises m signal inputs 1.1, 1.2, ... 1.m, by means of which m signal sources 2.1, 2.2, ... 2.m may be connected to the inputs of associated amplifier units 3.1, 3.2, ... 3.m, The outputs of the m amplifier units are each connected to an associated terminal of all of the switches 4.1, 4.2, 4.3, ... 4.n. The outputs of the n switches constitute the n signal outputs of the apparatus and are each connected to a respective transducer unit 5.1, 5.2, 5.3, ..., 5.n. A transducer unit may comprise one or more transducers (for example loudspeakers). The transducer units need not be identical and may have different power ratings. The apparatus further comprises k auxiliary amplifier units 6.1, 6.2, 6.3, ..., 6.k. One or more auxiliary amplifier units may be connected in parallel with an arbitrary amplifier unit. For this purpose the apparatus comprises the switching means 7, comprising the two sections 8 and 9. The section 8 of the switching means 7 comprises k switches 8.1, 8.2, 8.3, ... 8.k and the section 9 of the switching means 7 also comprises k switches 9.1, 9.2, 9.3, ..., 9.k.

Depending on the positions of the switches 8.1 and 9.1 the auxiliary amplifier unit 6.1 may be connected in parallel with a given one of the amplifier units 3.1 to 3.m. Alternatively, the auxiliary amplifier unit may not be connected in parallel with any amplifier unit, in which case the switches 8.1 and 9.1 are in the lower positions. The same applies to the other auxiliary amplifier units 6.2 to 6.k. Thus it is possible to connect either no auxiliary amplifier unit or one or more auxiliary amplifier units in parallel with an arbitrary amplifier unit.

It is obvious that the switches of the sections 8 and 9, which are connected to the input and the output respectively of the same auxiliary amplifier unit, are in the same positions. This is shown in FIG. 1 for the switches 8.1 and 9.1. The switches in the switching means 7 are controlled in dependence on the load (that is the number of transducer units) with which the output of an amplifier unit is loaded. This load is measured by a measuring unit 10 which, for example, determines the ratio between the average output voltage and the average output current of each amplifier unit. Another possibility is to employ solely the output current of the amplifier unit as information. This last-mentioned possibility is shown in more detail in FIG. 4. Depending on this information, which is applied to the switching means 7 via the line 11 in the form of control signals, as many auxiliary amplifier units may be connected in parallel with an amplifier unit (or disconnected from an amplifier unit) as is necessary in view of the load, by selectively energizing the various switches.

The number (k) of auxiliary amplifier units required in the apparatus in accordance with the invention depends on the following parameters:

the powers required by the n transducer units: $Q_1$ to $Q_n$ the powers of the amplifier units, $p_{v1}$ to $p_{vm}$ the powers of the auxiliary amplifier units $p_{h1}$ to $p_{hk}$.
The number k can now be determined by calculating how many auxiliary amplifier units have to be connected in parallel with the amplifier unit having the lowest output power in order to obtain the maximum drive of the transducer units when these are all connected to this amplifier unit, i.e. k should be determined from the formula $$p_{vj} + \sum_{i=1}^{k} p_{hi} = \sum_{i=1}^{n} Q_i \tag{5}$$

($p_{vj}$ is the power of the amplifier having the lowest output power). If this is simplified to a situation in which the output powers of the amplifier units are equal ($p_v$) and, moreover, the output powers of the auxiliary amplifier units are equal ($p_h$), formula (5) may be simplified to $$p_v + kp_h = \sum_{i=1}^{n} Q_i \text{ or } k = \frac{\sum_{i=1}^{n} Q_i - p_v}{p_h} \tag{6}$$

which formula, if the power requirements of the transducer units are also equal to each other (Q), may be simplified to the previously mentioned formula (2). A simple calculation now shows that in this simplified case the total power installed in the apparatus corresponds to formula (3)

$nQ+p_v(m-1)$ Watts, so that in comparison with the known apparatus this yields an economy of $(m+1)(nQ-p_v)$ Watts which corresponds to formula (4). A further simplification obtained by assuming that the output powers of the amplifier units and of the auxiliary amplifier units are equal to each other ($p_v=p_h=p$) yields the following formulas for the total number of amplifiers required $$N=m+k=m+(NQ/p)-1 \tag{7}$$

the total power installed:

$$P=nQ+p(m-1) \tag{8}$$

The number N of amplifiers required in such a simplified apparatus as a function of their power p is plotted in a graph in FIG. 2a and the total power P installed in the apparatus is also plotted as a function of the power p in FIG. 2b.

The curve 12 in FIG. 2a represents formula (7), which formula is also represented by curve 13 but here allowance has been made for the fact that N has to be an integer, which results in a stepped curve. It will be noticed that for $p \geq nQ$ the number of amplifiers required in the apparatus has decreased to m, corresponding to m amplifier units and no auxiliary amplifier units at all. This means that for such an apparatus the invention is of no use. It follows that the use of the inventive concept is restricted to values of $p < nQ$. For decreasing values of p a reduction of p is found to result in a proportionally higher increase of N. When considering the total power installed it will be apparent that this leads to a reduction of the total power installed. Curve 14 in FIG. 2b represents formula (8), which formula is also represented by the curve 15 because once again allowance must be made for the fact that N has to be an integer. It is evident that the installed power decreases for decreasing values of p and for very small values of p approximates to nQ, which is the minimum power required for driving the n transducer units each of which require a power of Q Watts.

FIG. 3 shows an apparatus in accordance with the invention similar to that shown in FIG. 1, but in which only one signal source 2.1 is connected to the apparatus (i.e. m=1). This embodiment yields an efficiency improvement in comparison with the corresponding known apparatus which comprises only one amplifier of nQ Watts (if all transducer units require the same power) as a result of the arrangement of k auxiliary amplifier units in parallel with amplifier unit 3.1. Amplifier unit 3.1, as well as the k (which is then equal to n−1) auxiliary amplifier units 6.1, 6.2, . . . etc, each supply for example, a power of Q Watts. It will be evident that if m=n=1 the inventive concept provides no improvement, that is to say it does not result in a reduction of the installed power. The inventive concept is of no use either in all those cases in which n=1 and m≠1. Then it suffices to use one amplifier unit for driving the single transducer unit and to arrange the switches used for switching a signal source to the transducer unit between the signal sources and the amplifier unit instead of between the amplifier and the transducer unit.

FIG. 4 shows in more detail a possible version of a part of the measuring unit 10 of FIGS. 1 and 3. FIG. 4 shows that part of the measuring unit 10 which is necessary for determining the magnitude of the load presented by the transducer units connected to the output of one amplifier unit, 3.i, and whether it is necessary to connect or disconnect one or more auxiliary amplifier units. Thus, the complete measuring unit 10 of FIG. 1 in fact comprises m circuits as shown in FIG. 4, namely one for each of the m amplifier units. FIG. 4 shows one channel with one signal source 2.i connected to the terminal 1.i of the apparatus. The signal line 21 connects the input of the amplifier unit 3.i to the section 8 of the switching unit 7 of FIGS. 1 and 3. The signal line 22 connects the output of the amplifier unit 3.i to the section 9 of the switching unit 7. The signal line 23 is connected to a terminal of each of the switches 4.1, 4.2, .. . 4.i (not shown). In the present example the magnitude of the load is determined by measuring the output current of the amplifier unit 3.i. Switching in an auxiliary amplifier unit should be effected before the output current of the amplifier unit 3.i has reached its maximum value. The value of the output current at the instant of switching should therefore be selected to be slightly smaller than said value. Assume that the peak value of the output current of the amplifier unit is $I_{max}$ at the instant of switching. By switching in an auxiliary amplifier unit the output current of the amplifier unit will decrease to approximately $\frac{1}{2}I_{max}$ (in the case where the amplifier unit and the auxiliary amplifier unit have the same output power). If the load on the amplifier unit now decreases, the output current becomes smaller than $\frac{1}{2}I_{max}$ and the amplifier unit is again capable of handling the load by itself. The instant at which an auxiliary amplifier unit may be disconnected therefore corresponds to a current which is slightly smaller than $\frac{1}{2}I_{max}$, for example 0.45 to 0.4 $I_{max}$. Hysteresis is created in this way in order to prevent an auxiliary amplifier unit from being connected or disconnected in the borderline case $\frac{1}{2}I_{max}$. When selecting this lower limit allowance has to be made for the available power surplus. The larger this surplus the greater the hysteresis which may be built in.

The output current of the amplifier unit is measured by measuring the voltage across a resistor 16 by means of a differential amplifier 17. Said resistor is arranged in series with the output of the amplifier unit 3.i. For simplicity no such resistor is shown in FIGS. 1 and 3. However, if the load is measured in the manner shown in FIG. 4, such a resistor should be arranged in series with the output of each amplifier unit.

A peak rectifier 18 and a low pass filter 19 convert the output signal of the differential amplifier 17 into a direct voltage. This voltage is compared with two reference voltages $U_{R1}$ and $U_{R2}$ in a two-bit A/D converter 20. The magnitudes of these reference voltages depend on the maximum permissible current $I_{max}$. The two-bit output $X_iY_i$ of the A/D converter 20 represents the following conditions:

| $X_i$ | $Y_i$ | CONDITION |
|---|---|---|
| 1 | 0 | $I > I_{max}$, which means an auxiliary amplifier unit must be connected |
| 0 | 0 | $0.45\ I_{max} < I < I_{max}$, no response |
| 0 | 1 | $I < 0.45\ I_{max}$ which means an auxiliary amplifier unit |

-continued

| $X_i$ | $Y_i$ | CONDITION |
|---|---|---|
| | | must be disconnected | where I is the output current of the amplifier unit 3.i. The last-mentioned operation cannot be carried out if there is no auxiliary amplifier unit connected in parallel with the amplifier unit 3.i. The two-bit number $X_iY_i$ is the control signal which is applied to the switching means 7 via the line 11.i.

In the foregoing it is assumed that the input voltage and, consequently, the output voltage of the amplifier unit 3.i is constant. Since the value of the output current of the amplifier unit 3.i is used as an indication of whether or not an auxiliary amplifier unit should be connected or disconnected, an auxiliary amplifier unit may not only be connected in response to a load increase but also in response to an increase of the input voltage. It is obvious that this will occur at the instant that the amplifier unit supplies its maximum permissible output current.

In order to prevent an auxiliary amplifier unit from being connected and subsequently disconnected when each signal peak of an input signal comprising many high signal peaks occurs—which would result in annoying switching pulses in the output signal of the apparatus —when the circuit of FIG. 4 is employed a connected auxiliary amplifier unit remains connected until a specific time interval has elapsed after the occurrence of a signal peak, i.e. it is not disconnected until this time interval has elapsed. However, if a new signal peak occurs within the said time interval the auxiliary amplifier also remains connected for the said time interval after said new signal peak has occurred. This time internal can be adjusted by adjusting the time constant of the low-pass filter 19.

As already stated the complete measuring unit 10 of FIG. 1 comprises m times the circuit of FIG. 4. This means that the line 11 in FIG. 1 in fact comprises m connections such as 11.i in FIG. 4, so that control signals representing m two-bit numbers XY, which two-bit numbers each correspond to an associated amplifier unit, are applied to the switching means 7 via line 11.

A decision chart in FIG. 5 illustrates how the switching means 7 operates in dependence on the m two-bit control signals XY applied to it via the line 11. At the beginning of the programme (block 24) the value zero is assigned to two parameters i and r (block 25). The parameter i is a running variable which varies from 1 to m in the course of the program, m being the number of amplifier units. When r=0 it is ascertained whether one or more auxiliary amplifier units should be connected in parallel with one of the amplifier units and when r=1 it is ascertained whether one or more auxiliary amplifier units should be disconnected from one of the amplifier units. Firstly, the number i is incremented by one in block 27. Subsequently, the programme proceeds via block 28 to block 29 where bit X corresponding to the first amplifier unit is read in. If the value of $X_1$ is zero no auxiliary amplifier unit should be connected in parallel with the first amplifier unit. In such a case the programme returns via block 31 to block 27 where the value of i is again incremented by one, after which bit X corresponding to the next amplifier unit is read in. If the value of bit $X_i$ is 1 an auxiliary amplifier unit should be connected in accordance with the Table given in the foregoing. For this purpose it is determined in block 34 whether auxiliary amplifier unit j, j ranging from 1 to k (see blocks 33 and 35) is already connected to an amplifier unit. If this is not the case, the auxiliary amplifier unit j is connected in parallel with the amplifier unit i in block 36. Subsequently, the same amplifier unit is again tested via blocks 37, 31 and 27 in order to ascertain whether more auxiliary amplifier units should be connected in parallel. When all the m amplifier units have thus been tested for the necessity of connecting an additional auxiliary amplifier unit thereto, the value of i is set to zero and that of r to 1 via blocks 31 and 32. The programme now proceeds via blocks 27 and 28 to block 38, where bit Y, corresponding to the first amplifier unit, is read in. If the value $Y_1$ is zero, no auxiliary amplifier unit should be disconnected. In such a case the programme returns via block 40 to block 27, where the value of i is again incremented by one, after which bit Y corresponding to the next amplifier unit is read in. If the value of bit $Y_1$ is 1 an auxiliary amplifier unit should be disconnected from the associated amplifier unit i in accordance with the foregoing Table. For this purpose is is determined in block 43 whether auxiliary amplifier unit j, j ranging from 1 to k (see blocks 42, 44 and 45), is already connected to amplifier unit i. If this is the case, the auxiliary amplifier unit j is disconnected from amplifier unit i in block 46. Subsequently the same amplifier unit is again tested via blocks 47, 40 and 27 to ascertain whether more auxiliary amplifier units must be disconnected. If $Y_i=1$ is detected in the programme but no auxiliary amplifier unit is found to be connected in parallel with the amplifier unit i during the search procedure in block 43, the programme returns to 27 via block 44 (the value j has then reached the maximum value K) and block 40. No auxiliary amplifier unit is disconnected and the programme proceeds to test the next amplifier unit. When all m amplifier units have been tested in this way for the necessity of disconnecting an auxiliary amplifier unit, the value of i is reset to zero and that of r to zero via blocks 40 and 41. The programme now proceeds via blocks 27 and 28 to block 29 for again testing the bits $X_i$.

It is to be noted that the invention is not limited to the embodiments described herein. The invention may also be employed in devices which differ from the embodiments shown with respect to points which do not relate to the inventive concept.

What is claimed is:

1. An apparatus for driving n transducer units (n>1) with each transducer unit including one or more electro-acoustic transducers, said apparatus comprising m signal inputs (m≧1) for connecting m signal sources to the apparatus, means connecting each signal input to an input of an associated amplifier unit, n signal outputs to which said n transducer units may be connected, a signal input being connectable to one or more of the signal outputs via the associated amplifier unit, k auxiliary amplifier units (k≧1), and switching means for connecting one or more auxiliary amplifier units in parallel with an arbitrary amplifier unit.

2. An apparatus as claimed in claim 1 wherein all of the auxiliary amplifier units have substantially the same output power capability.

3. An apparatus as claimed in claim 1 wherein all of the amplifier units have substantially the same output power capability.

4. An apparatus as claimed in claim 3, wherein the output power capability of the individual amplifier units is substantially equal to the output power capability of the individual auxiliary amplifier units.

5. An apparatus as claimed in claim 4 wherein the output power capability of each amplifier unit is smaller than the power-handling capability of a transducer unit to be connected to its signal output.

6. An apparatus as claimed in claim 5, wherein the output power capability of each of the auxiliary amplifier units is smaller than the power-handling capability of an arbitrary transducer unit.

7. An apparatus as claimed in claim 1 further comprising a measuring unit for measuring the load on an amplifier unit and supplying control signals to the switching means, said switching means being responsive to said control signals so that, when the load on said amplifier unit increases, it connects as many auxiliary amplifier units in parallel with said amplifier unit as is necessary to supply the increased load on the amplifier unit and, when the load on said amplifier unit decreases, it disconnects as many auxiliary amplifier units from said amplifier unit as is sufficient to supply the reduced load on the amplifier unit.

8. An apparatus as claimed in claim 1 which further comprises n transducer units (n>1), said units each comprising one or more electro-acoustic transducers, said transducer units each being connected to their associated signal outputs.

9. An apparatus as claimed in claim 2 wherein all of the amplifier units have substantially the same rated output power.

10. An apparatus as claimed in claim 9 wherein the rated output power of the individual amplifier units is substantially equal to the rated output power of the individual auxiliary amplifier units.

11. An apparatus as claimed in claim 2 wherein the rated output power of the individual amplifier units is substantially equal to the rated output power of the individual auxiliary amplifier units.

12. An apparatus as claimed in claim 1 wherein the rated output power of each amplifier unit is less than the rated power of a transducer unit to be connected to its signal output.

13. An apparatus as claimed in claim 2 wherein the rated output power of each amplifier unit is less than the rated power of a transducer unit to be connected to its signal output.

14. An apparatus as claimed in claim 3 wherein the rated output power of each amplifier unit is less than the rated output power of a transducer unit to be connected to its signal output.

15. An apparatus as claimed in claim 14 wherein all of the auxiliary amplifier units have substantially the same rated output power.

16. An apparatus as claimed in claim 1 wherein the rated output power of each auxiliary amplifier unit is less than the rated power of an arbitrary transducer unit.

17. An apparatus as claimed in claim 16 wherein all of the auxiliary amplifier units have substantially the same rated output power.

18. An apparatus as claimed in claim 16 wherein all of the amplifier units have substantially the same rated output power.

19. An apparatus as claimed in claim 2 further comprising a measuring unit for measuring the load on an amplifier unit and supplying control signals to the switching means, said switching means being responsive to said control signals so that, when the load on said amplifier unit increases, it connects as many auxiliary amplifier units in parallel with said amplifier unit as is necessary to supply the increased load on the amplifier unit and, when the load on said amplifier unit decreases, it disconnects as many auxiliary amplifier units from said amplifier unit as is sufficient to supply the reduced load on the amplifier unit.

20. An apparatus as claimed in claim 3 further comprising a measuring unit for measuring the load on an amplifier unit and supplying control signals to the switching means, said switching means being responsive to said control signals so that, when the load on said amplifier unit increases, it connects as many auxiliary amplifier units in parallel with said amplifier unit as is necessary to supply the increased load on the amplifier unit and, when the load on said amplifier unit decreases, it disconnects as many auxiliary amplifier units from said amplifier unit as is sufficient to supply the reduced load on the amplifier unit.

21. An apparatus for driving n transducer units, where $n > 1$, with each transducer unit including at least one electroacoustic transducer, said apparatus comprising: m signal inputs, where $m \geq 1$, for connecting m signal sources to the apparatus, n signal outputs for connecting said n transducer units to the apparatus, a plurality of amplifier units, k auxiliary amplifier units, where $k \geq 1$, switching means for connecting one or more auxiliary amplifier units in parallel with an arbitrary amplifier unit, and means connecting each signal input to an input of an associated amplifier unit independently of said switching means so that a signal input is connectable to one or more of the signal outputs via the associated amplifier unit.

22. An amplifier system for driving a plurality of n transducer units, where $n > 1$, comprising: m signal inputs adapted for connection to m respective signal sources, where $m \geq 1$, m amplifier units connected respectively to associated ones of the m signal inputs, n signal outputs adapted for connection to said n transducer units, first switching means for selectively connecting said m amplifier units to one or a plurality of said signal outputs, k auxiliary amplifier units, where $k \geq 1$, and second switching means for selectively connecting one or a plurality of the auxiliary amplifier units in parallel with a selected one of the amplifier units.

23. An amplifier system as claimed in claim 22 wherein each of said signal inputs is directly connected to an input of its associated amplifier unit.

24. An amplifier system as claimed in claim 22 wherein each signal input is individually connected exclusively to an input of only one amplifier unit.

25. An amplifier system as claimed in claim 22 wherein each of the auxiliary amplifier units has a power rating of Ph watts and each of the amplifier units has a power rating of $P_v$ watts, and wherein the number k of auxiliary amplifier units is chosen according to the relationship $$k = \frac{nQ - p_v}{p_h},$$

where each of the transducer units has a power rating of Q watts.

26. An amplifier system as claimed in claim 22 wherein the total rated power of the amplifier system is $P_T = nQ + P_v(m-1)$ watts, where each transducer unit has a power rating of Q watts and each amplifier unit has a power rating of $P_v$ watts.

27. An amplifier system as claimed in claim 22 wherein each of the amplifier units and each of the auxiliary amplifier units have the same power rating, p, and the total number of amplifier units is $$N = m + k = m + \frac{nQ}{p} - 1,$$

where each transducer unit has a power rating of Q watts.

28. An amplifier system as claimed in claim 22 wherein all of the auxiliary amplifier units have the same rated power, all of the amplifier units have the same rated power, and wherein the rated power of each amplifier unit and each auxiliary amplifier unit is less than the rated power of a transducer unit.

29. An amplifier system as claimed in claim 28 wherein the rated power of the individual amplifier units is equal to the rated power of the individual auxiliary amplifier units.

* * * * *